United States Patent
Tavrow et al.

[19]

[11] Patent Number: 5,991,217
[45] Date of Patent: Nov. 23, 1999

[54] FAST SRAM DESIGN USING EMBEDDED SENSE AMPS

[75] Inventors: Lee Stuart Tavrow; Mark Ronald Santoro, both of Sunnyvale, Calif.

[73] Assignee: Micro Magic, Inc., Sunnyvale, Calif.

[21] Appl. No.: 08/967,194

[22] Filed: Oct. 29, 1997

Related U.S. Application Data

[63] Continuation of application No. 08/774,966, Dec. 26, 1996, abandoned.

[51] Int. Cl.$^6$ ...................................................... G11C 7/00
[52] U.S. Cl. ............................................ 365/208; 365/207
[58] Field of Search ........................................ 365/205, 207, 365/208; 327/51, 52, 53

[56] References Cited

U.S. PATENT DOCUMENTS

| | | | |
|---|---|---|---|
| 5,353,255 | 10/1994 | Kumoro | 365/208 |
| 5,570,319 | 10/1996 | Santoro et al. | 365/230.03 |
| 5,579,273 | 11/1996 | Childers et al. | 365/208 |

*Primary Examiner*—Vu A. Le
*Attorney, Agent, or Firm*—Limbach & Limbach L.L.P.

[57] ABSTRACT

The speed of large SRAMs is improved by embedding sense amplifiers into the SRAM core. In this way, the bit line length that the SRAM cells must drive is very short and, thus, the slew rate is fast. An additional layer of metal is employed to route and accumulate the sense amp results vertically over the entire SRAM core. To reduce the required pitch of the additional metal layers, a sense amp muxing scheme is also provided.

2 Claims, 3 Drawing Sheets

FAST SRAM DESIGN USING EMBEDDED SENSE AMPS

This is a continuation of application Ser. No. 08/774,966 filed on Dec. 26, 1996 now abandoned.

BACKGROUND OF THE INVENTION

1. Field of the Invention

SRAM access time can be dominated by the bit line swing in large SRAMs. The present invention relates to embedding multiple sense amps into the SRAM core with the SRAM cells and interconnecting the sense amps over the array, thereby reducing the effective bit line length and improving access time significantly.

2. Description of the Prior Art

SRAMs consist of an array of SRAM cells. To access a given set of cells, a given word line is activated which is connected to every SRAM cell in a given row. Depending on the state of the SRAM cell, an activated SRAM cell either pulls charge out of the true or complement column lines which are referred to as bit lines. The bottom of the array consists of sense amplifiers that are connected to the differential bit lines and which sense and amplify the resultant signal from the SRAM cells. Various multiplexing schemes both before and after the sense amps reduce the data output width to the desired size.

Particularly in large SRAMs, where there are many rows of SRAM cells (e.g., over 100), the slew rate on the bit lines is very slow. This is because the capacitance on the bit lines is high and the SRAM cell current is small and, hence, the access time is poor.

There are three standard techniques for improving the bit line slew rate:

1. Increase the cell current. This must be accomplished without increasing the cell size significantly or the improved current will have a larger capacitance to drive, which will nullify its effect.
2. Reduce the number of cells on the bit line by reducing the number of rows in the array. The desired SRAM size can then be preserved either by increasing the number of columns and muxing or by building multiple banks of SRAM cells and muxing the results together.
3. Reduce the signal swing required for the sense amp to accurately sense the bit lines.

Approaches (1) and (3) have been applied successfully over many generations of relatively small SRAMs. For large, fast SRAMs, approach (2) has recently also been used. In particular, most large, fast SRAMs employ multiple small banks to achieve their faster access times.

Multiple banks of smaller SRAMs, however, have a set of problems. Muxing the banks together increases the overhead of the periphery circuitry and adds to the access time, partially negating the increased access time of the individual banks. Some of the muxing and wiring can be eliminated in the banked approach by muxing the output of each bank down to a single output bit, for example. However, this requires each bank to be accessed on every cycle, thus greatly increasing the power consumption of the overall SRAM.

SUMMARY OF THE INVENTION

In accordance with the present invention, we provide a technique for making large, fast SRAMs by embedding sense amplifiers into the SRAM core. In this way, the bit line length that the SRAM cells must drive is very short and, thus, the slew rate is fast. An additional layer of metal is employed to route and accumulate the sense amp results vertically over the entire SRAM core. In order to reduce the required pitch of the additional metal layers, a sense amp muxing scheme is also provided.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
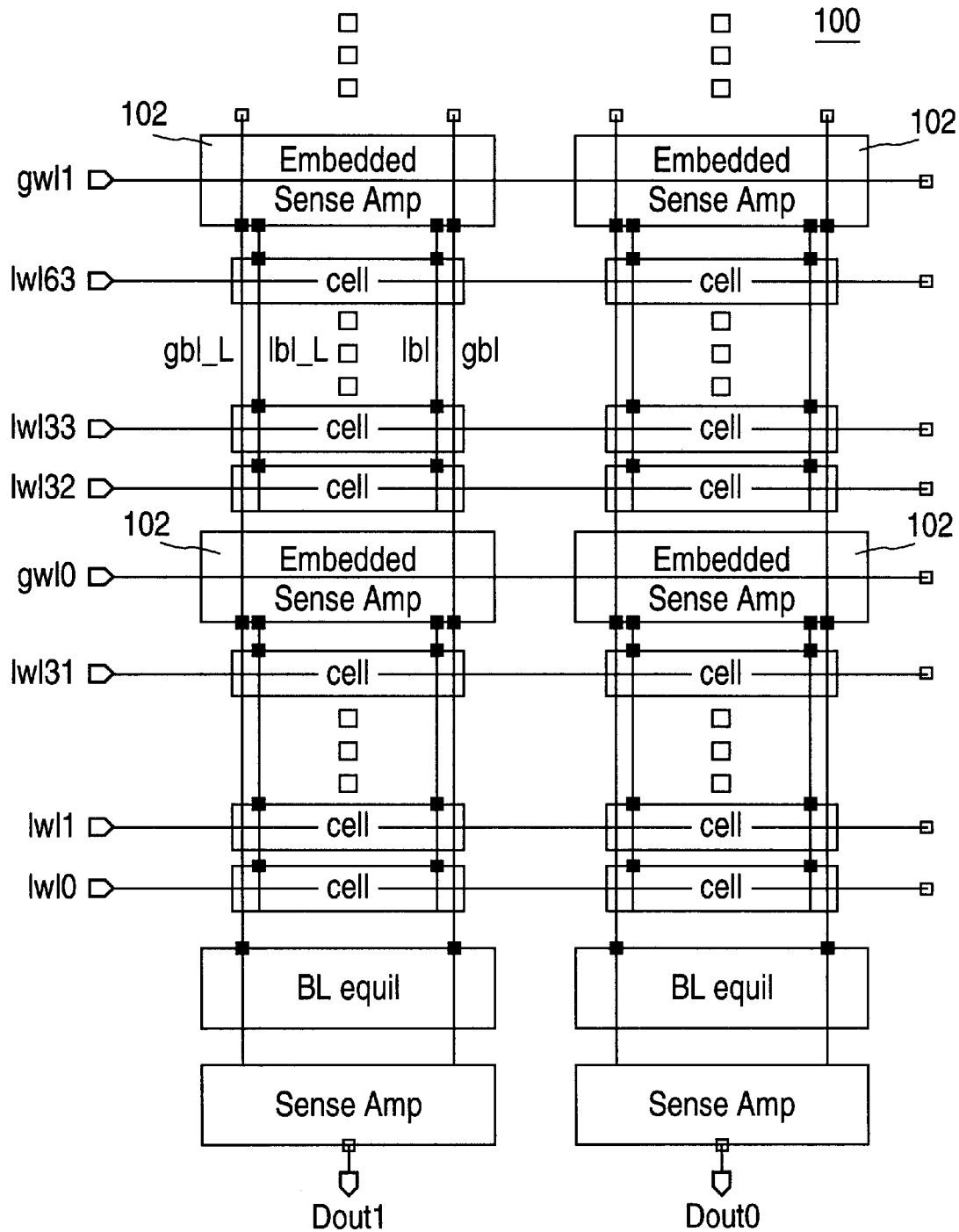
FIG. 1 is a block diagram illustrating an SRAM array with embedded sense amplifiers in accordance with the present invention.

FIG. 1 shows a basic SRAM structure 100 with the sense amplifiers 102 embedded into the cell array. In this embodiment, 32 cells are connected to each embedded sense amp 102. Hence, the bit line slew rate is very fast unlike if, for example, 256 cells were connected to the bit lines in a conventional design of this size. Also in this embodiment, the local bit lines (lbl and lbl_L) are in Metal2 and the global bit lines (gbl and gbl_L) are in Metal3. Note that Metal3 is shared between the global bit lines and power (vdd and gnd) which is not shown.

Figure 2:
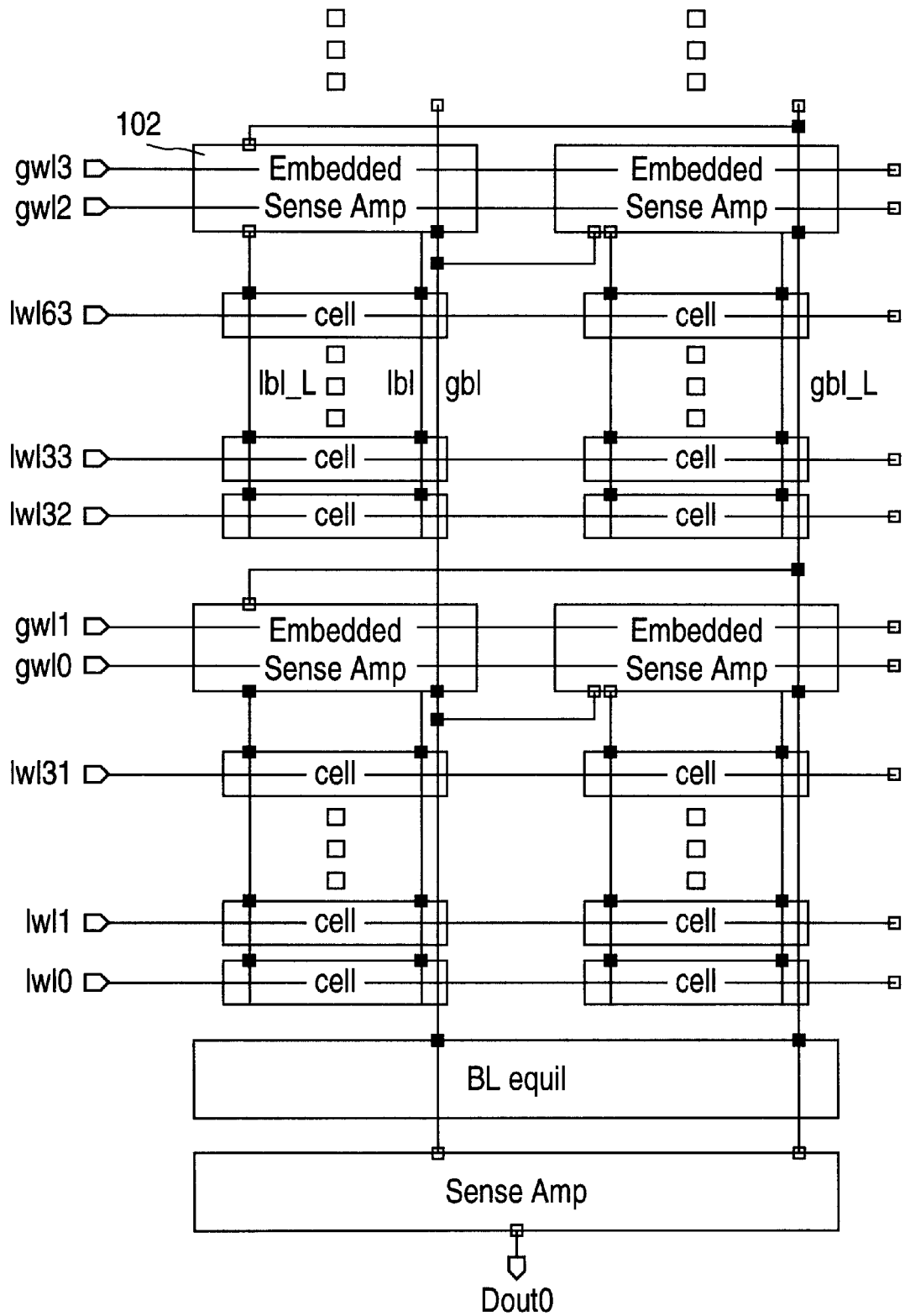
FIG. 2 is a block diagram illustrating an SRAM array with embedded sense amplifiers in accordance with the present invention which employs a 2:1 intrinsic multiplexing function.

FIG. 2 illustrates the same structure, but employing a 2:1 intrinsic multiplexing function. The mux is controlled by the selection of either the even or odd global word lines (gwl). Note that the number of vertical wires in the FIG. 2 structure 200 is reduced over the simple circuit 100 shown in FIG. 1. Note that the preferred implementation uses a 4:1 intrinsic mux.

Figure 3:
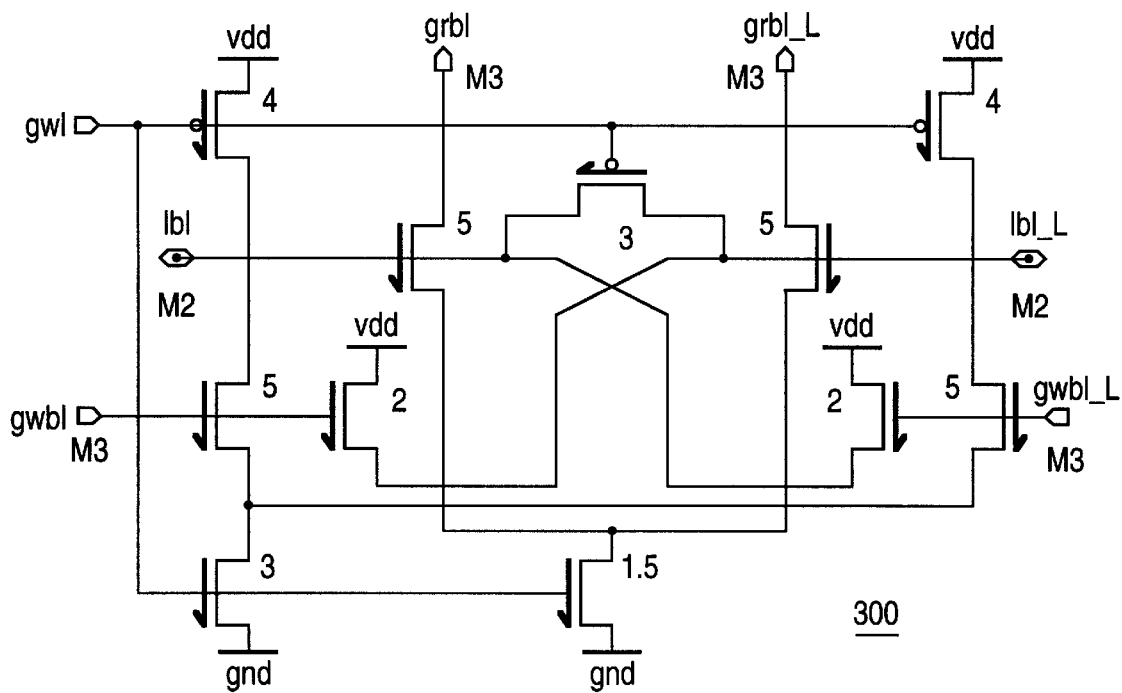
FIG. 3 is a schematic diagram illustrating an embedded sense amplifier in accordance with the present invention.

FIG. 3 shows a circuit 300 for the embedded sense amp 102 in CMOS. Note that this circuit 300 is used for both reading and writing. During SRAM reading, the gwl is activated, which then senses the local bit line voltage and amplifies in onto the global bit lines. The sense amp circuit 300 is a static CMOS transconductance amplifier the current source of which is controlled by the gwl. The current gain of the sense amp 300 over the cell current is specified by adjusting the current source transistor in the sense amp. Hence, even though the global bit lines are long, the slew rate is fast because of the current gain in the sense amp.

The embedded sense amplifier 300 both amplifies the signals from the SRAM cell bit lines during reading and amplifies the write data signals onto the SRAM cell bit lines during writing.

It is noted that there are separate global bit line signals attached to the embedded sense amplifier 300 for reading versus writing, both of which are differential.

During writing, either the global write bit line (gwbl) or global write bit line complement (gwbl_L) is raised in addition to the gwl. Depending on which of the gwbl or gwbl_L signals is raised, either the local bit line (lbl) or local bit line complement (lbl_L) is then pulled to ground while the other one is held high. By driving the local bit lines, the appropriate cell is written. In this way, both the SRAM read and write speeds are improved with the sense amp.

Because of the efficient use of wiring over the SRAM core, this design has much less overhead than other high speed designs employing banking.

Figure 4:
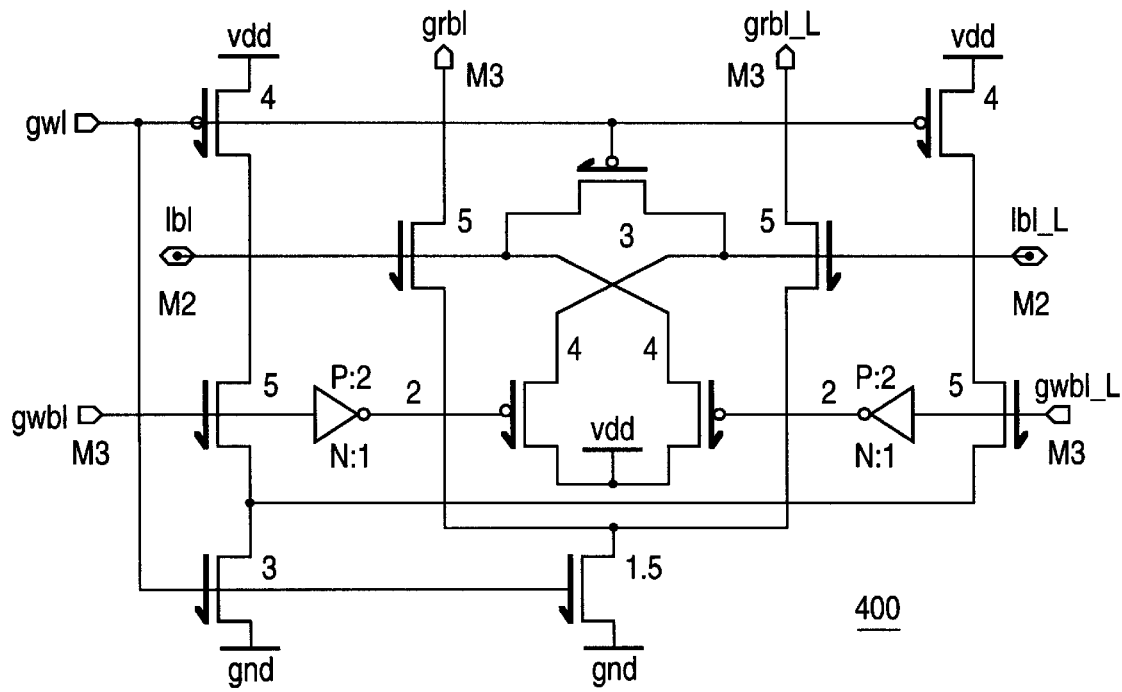
FIG. 4 is a schematic diagram illustrating an alternate embodiment of an embedded sense amplifier in accordance with the present invention.

FIG. 4 shows an alternative circuit 400 for the embedded sense amplifier. In the FIG. 3 circuit 300, an nFET source follower is employed to maintain the high signal on the local bit line (lbl) during writing. In the FIG. 4 circuit 400, a pFET driven by an inverter is used.

As voltages scale down, the FIG. 4 circuit 400 may become more desirable. However, the FIG. 3 circuit 300 is currently preferred.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An embedded sense amplifier circuit comprising:

a first p-channel transistor having its source connected to a positive voltage supply, its drain connected to a local bit line and its gate connected to a global word line;

a second p-channel transistor having its source connected to the positive supply voltage, its drain connected to a local bit line complement and its gate connected to the global word line;

a third p-channel transistor having a first source/drain electrode connected to the local bit line, a second source/drain electrode connected to the local bit line complement, and its gate connected to the global word line;

a first n-channel transistor having its drain connected to a global read bit line and its gate connected to the local bit line;

a second n-channel transistor having its drain connected to a global read bit line complement and its gate connected to the local bit line complement;

a third n-channel transistor having its drain connected to the source of the first n-channel transistor and to the source of the second n-channel transistor, its source connected to a negative supply voltage, and its gate connected to the global word line;

a fourth n-channel transistor having its drain connected to the positive power supply, its source connected to the local bit line complement, and its gate connected to a global write bit line;

a fifth n-channel transistor having its drain connected to the positive voltage supply, its source connected to the local bit line, and its gate connected to a global write bit line complement;

a sixth n-channel transistor having its drain connected to the local bit line, and its gate connected to the global write bit line;

a seventh n-channel transistor having its drain connected to the local bit line complement and its gate connected to the global write bit line complement, the sources of the sixth and seventh n-channel transistors being commonly-connected; and an eighth n-channel transistor having its drain connected to the commonly-connected sources of the sixth and seventh n-channel transistors, its source connected to the negative power supply and its gate connected to the global word line.

2. An embedded sense amplifier circuit comprising:

a first p-channel transistor having its source connected to a positive voltage supply, its drain connected to a local bit line and its gate connected to a global word line;

a second p-channel transistor having its source connected to the positive supply voltage, its drain connected to a local bit line complement and its gate connected to the global word line;

a third p-channel transistor having a first source/drain electrode connected to the local bit line, a second source/drain electrode connected to the local bit line complement, and its gate connected to the global word line;

a first p-channel transistor having its drain connected to a global read bit line and its gate connected to the local bit line;

a second n-channel transistor having its drain connected to a global read bit line complement and its gate connected to the local bit line complement;

a third n-channel transistor having its drain connected to the source of the first n-channel transistor and to the source of the second n-channel transistor, its source connected to a negative supply voltage, and its gate connected to the global word line;

a fourth p-channel transistor having its drain connected to the positive power supply, its source connected to the second source/drain electrode of the third p-channel transistor, and its gate connected to receive a signal from a global write bit line via a first inverter;

a fifth p-channel transistor having its drain connected to the positive voltage supply, its source connected to the first source/drain electrode of the third p-channel transistor, and its gate connected to receive a signal from a global write bit line complement via a second inverter;

a fourth n-channel transistor having its drain connected to the local bit line, and its gate connected to the global write bit line;

a fifth n-channel transistor having its drain connected to the local bit line complement and its gate connected to the global write bit line complement, the sources of the fourth and fifth n-channel transistors being commonly-connected; and a sixth n-channel transistor having its drain connected to the commonly-connected sources of the fourth and fifth n-channel transistors, its source connected to the negative power supply and its gate connected to the global word line.

* * * * *